(12) United States Patent
Hu

(10) Patent No.: US 9,439,282 B2
(45) Date of Patent: Sep. 6, 2016

(54) METHOD FOR MANUFACTURING PRINTED CIRCUIT BOARD

(71) Applicant: Zhen Ding Technology Co., Ltd., Tayuan, Taoyuan (TW)

(72) Inventor: Wen-Hung Hu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 503 days.

(21) Appl. No.: 13/949,237

(22) Filed: Jul. 24, 2013

(65) Prior Publication Data

US 2014/0083744 A1    Mar. 27, 2014

(30) Foreign Application Priority Data

Sep. 26, 2012   (CN) .......................... 2012 1 03630827

(51) Int. Cl.
| | |
|---|---|
| H05K 1/09 | (2006.01) |
| H05K 1/02 | (2006.01) |
| H05K 3/00 | (2006.01) |
| H01L 23/13 | (2006.01) |
| H01L 21/48 | (2006.01) |
| H05K 1/18 | (2006.01) |
| H05K 3/46 | (2006.01) |

(52) U.S. Cl.
CPC ......... *H05K 1/0298* (2013.01); *H01L 21/4857* (2013.01); *H01L 23/13* (2013.01); *H05K 3/0058* (2013.01); *H05K 3/4697* (2013.01); *H01L 2924/0002* (2013.01); *H05K 1/186* (2013.01); *H05K 3/4602* (2013.01); *H05K 2201/09127* (2013.01)

(58) Field of Classification Search
CPC .......... H05K 1/00; H05K 3/34; H05K 3/287; H05K 3/0023; H05K 3/3484; B23K 35/26; B23K 35/262; G03F 7/20; G03F 7/38; B09C 1/10
USPC ........ 174/250, 251, 257; 435/262.5; 148/24; 430/319
See application file for complete search history.

(56) References Cited

FOREIGN PATENT DOCUMENTS

| TW | 397681 U | 2/2011 |
|---|---|---|
| TW | M397681 U1 | 2/2011 |
| TW | 201204202 A | 1/2012 |
| TW | 201204202 A1 | 1/2012 |

*Primary Examiner* — Tremesha S Willis
(74) *Attorney, Agent, or Firm* — Zhigang Ma

(57) ABSTRACT

A printed circuit board includes a first trace layer, a first dielectric layer, a second trace layer, a second dielectric layer, a third trace layer, a third dielectric layer and a fourth trace layer arranged in that order. A cavity is defined in the printed circuit board running through from the fourth trace layer to the second dielectric layer. Portion of the second dielectric layer is exposed in the cavity. Surfaces of the fourth trace layer combining with the second dielectric layer, and surfaces of the second trace layer combining with the first dielectric layer, are all roughened to increase the strength of adhesion.

13 Claims, 16 Drawing Sheets

METHOD FOR MANUFACTURING PRINTED CIRCUIT BOARD

BACKGROUND

1. Technical Field

The present disclosure generally relates to printed circuit boards (PCBs), and particularly relates to a printed circuit board and a method for manufacturing the printed circuit board.

2. Description of Related Art

To accommodate development of miniaturized electronic products with multiple functions, multilayer printed circuit boards are widely used due to their special characteristics such as lightness, and high-density interconnectiblity.

Many electronic elements need to be packaged on the PCB, in electronic communication with the electrically conductive traces of the PCB. In order to reduce packaging height, a cavity for receiving the electronic elements is formed when manufacturing the PCB. Some of the electrically conductive traces in an inner layer in the cavity are exposed. A method for manufacturing the PCB with cavity generally includes a step of laminating an adhesive sheet and an outer electrically conductive layer on an inner layer substrate having traces. The adhesive sheet is generally pre-preg. The pre-preg includes B-stage resin. When the pre-preg is heated and pressed, the resin in the pre-preg can flow and have an adhesive ability, thus the inner layer substrate and the outer electrically conductive layer are adhered by the adhesive sheet. When the adhesive sheet is hot pressed, the overflow of resin in the adhesive sheet is hard to control. The overflow of resin on the traces is hard to remove, such that the PCB with a cavity has to be discarded. In order to overcome the problem, a peelable film is usually attached on part surface of the inner layer substrate corresponding to the cavity, before the adhesive sheet is laminated. The peelable film protects the traces. Thus, in applying the peelable film, the cost of manufacturing the printed circuit board is higher.

What is needed, therefore, is a printed circuit board and a method for manufacturing a printed circuit board to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board includes the following steps.

Figure 1:
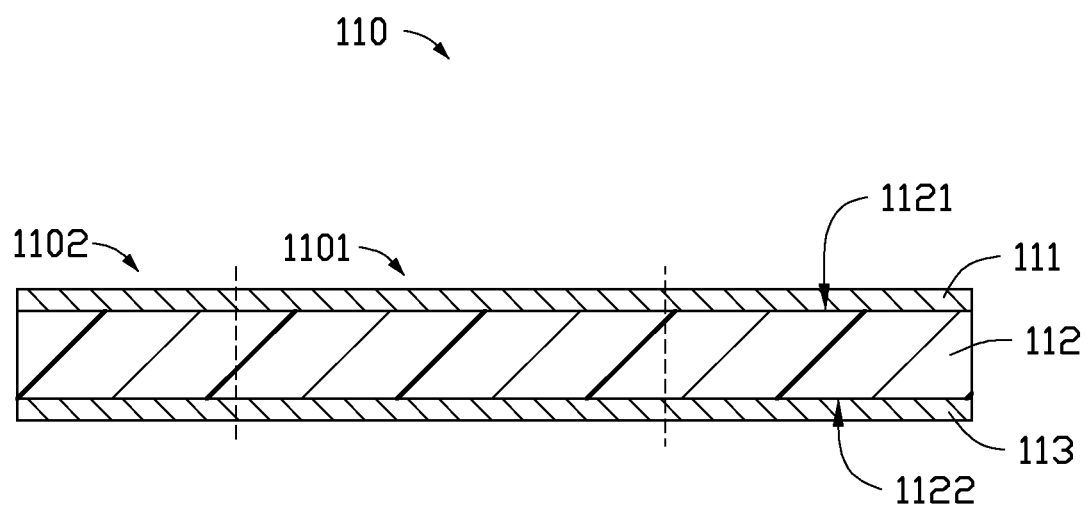
FIG. 1 shows a core substrate including a first dielectric layer according to an exemplary embodiment.

FIG. 1 shows step 1, in which a core substrate 110 is provided. The core substrate 110 includes a first copper layer 111, a first dielectric layer 112, and a second copper layer 113. The first dielectric layer 112 includes a first surface 1121 and a second surface 1122 opposite to the first surface 1121. The first copper layer 111 is formed on the first surface 1121. The second copper layer 113 is formed on the second surface 1122. The core substrate 110 includes a inner region 1101 and a trace region 1102 surrounding the inner region 1101. Material of the first dielectric layer 112 may be polyimide (PI), polyethylene terephthalate (PET), polyethylene naphthalate (PEN), pre-preg (PP) and Ajinomoto build-up film (ABF).

Figure 2:
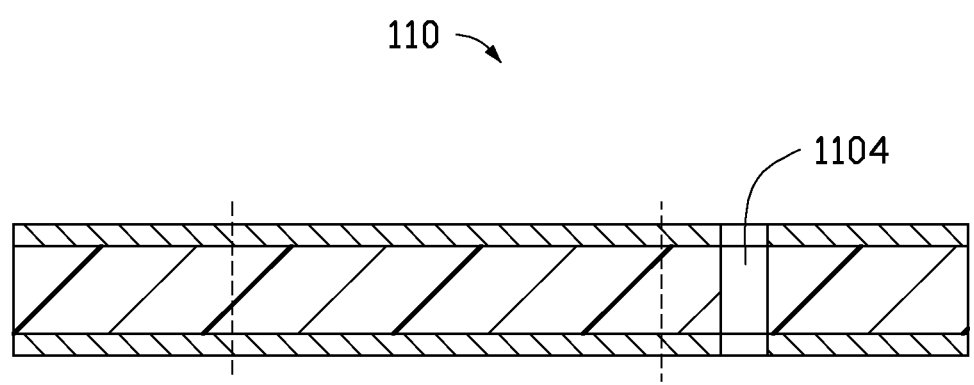
FIG. 2 shows a first through hole defined in the core substrate of FIG. 1.
Figure 3:
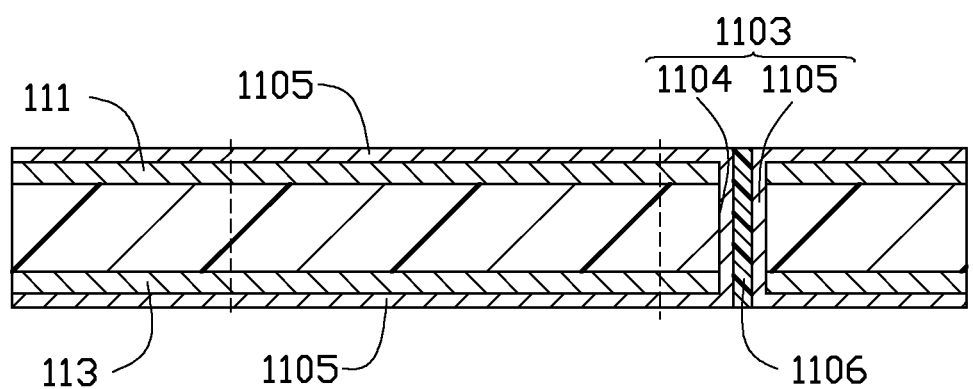
FIGS. 3 and 4 show filling material formed in the through hole, a first trace layer and a peelable metal layer formed on a first surface of the first dielectric layer, and a second trace layer formed on a second surface of the first dielectric layer of FIG. 2.
Figure 4:
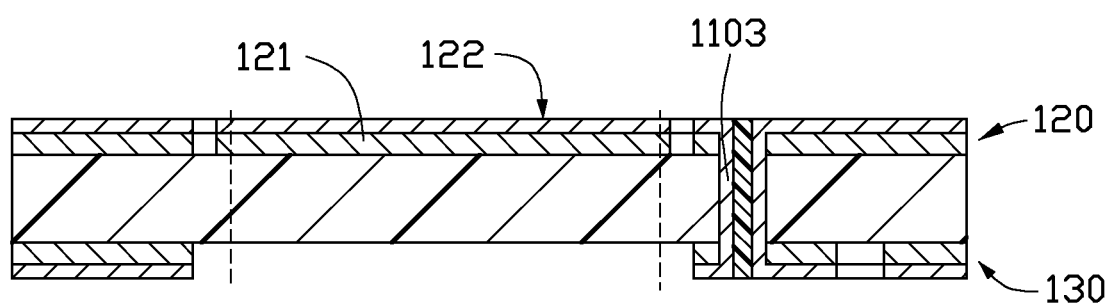

FIGS. 2-4 show step 2, in which a plated through hole 1103 is formed in the core substrate 110, a first trace layer 120 and a peelable metal 121 are formed on the first surface 1121 of the first dielectric layer 112, and a second trace layer 130 is formed on the second surface 1122 of the first dielectric layer 112.

Step 2 in detail is as follows. Firstly, a through hole 1104 is defined in the core substrate 110. A plated metal layer 1105 formed on the inner wall of through hole 1104, a surface of the first copper layer 111, and a surface of the second copper layer 113. The plated metal layer 1105 is formed on the inner wall of through hole 1104, thus a plated through hole 1103 is obtained. The first copper layer 111 electrically connects with the second copper layer 113 through the plated through hole 1103. The through hole 1104 may be formed by drilling or laser ablation. The plated metal layer 1105 may be formed by electro-less plating. In present embodiment, a filling material 1106 is put into through hole 1104, the filling material 1106 contacts the plated metal layer 1105 in the through hole 1104.

Then, the first trace layer 120 is formed by selectively removing portions of first copper layer 111 and the plated metal layer 1105 in the trace region 1102. The first copper layer 111 and the plated metal layer 1105 in the inner region 1102 cooperatively form the peelable metal layer 121. The second trace layer 130 is formed by selectively removing portions of second copper layer 113 and the plated metal layer 1105 in the trace region 1102. The first trace layer 120 and the second trace layer 130 can be formed by using a photolithography process and an etching process.

In present embodiment, an area of the peelable metal layer 121 is larger than that of the inner region 1101, thus the peelable metal layer 121 covers a surface of portion of the first dielectric layer 112 in the inner region 1101 and a surface of portion of the first dielectric layer 112 in the trace region 1102 adjacent to the inner region 1101. The peelable metal layer 121 has a smooth surface 122 and a side surface 123. The smooth surface 122 is furthest away from the first dielectric layer 112. The side surface 123 interconnects the smooth surface 122 and the first dielectric layer 112.

Figure 5:
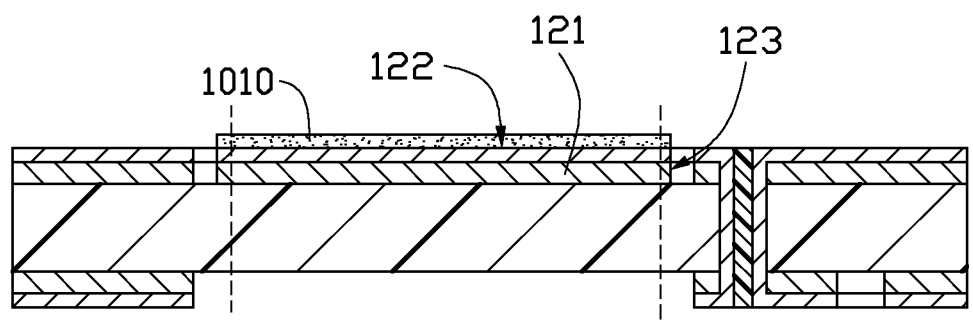
FIG. 5 shows a photoresist layer formed on the peelable metal layer of FIG. 4.

FIG. 5 shows step 3, in which a photoresist layer 1010 is formed on the smooth surface 122 of the peelable metal layer 120.

The photoresist layer 1010 may be formed by laminating dry film or printing liquid ink. The photoresist layer 1010 protects the smooth surface 122.

Figure 6:
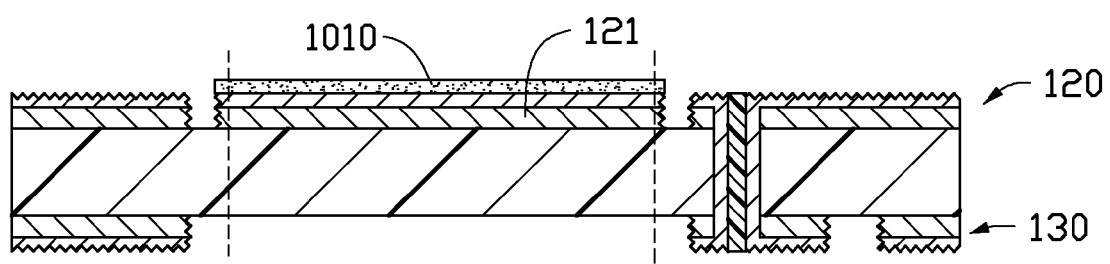
FIG. 6 shows a surface of the first trace layer and a surface of the second trace layer of FIG. 5 roughened.

FIG. 6 shows step 4, in which the surface of the first trace layer 120, the surface of the second trace layer 130, and the side surface 123 of the peelable metal layer 121 are roughened by etching.

By controlling the duration of the etching time and concentration of the etchant, portion of material at the surface of the first trace layer 120, at the surface of second trace layer 130 and at the side surface 123 of the peelable metal layer 120 is removed, the other potion of the material at the surface of the first trace layer 120, at the surface of second trace layer 130 and at the side surface 123 of the peelable metal layer 120 remains, and a number of micro recesses are formed at the surface of the first trace layer 120, at the surface of second trace layer 130, and at the side surface 123 of the peelable metal layer 120. Thereby, the surface of the first trace layer 120, the surface of the second trace layer 130 and the side surface 123 of the peelable metal layer 121 are roughened.

Figure 7:
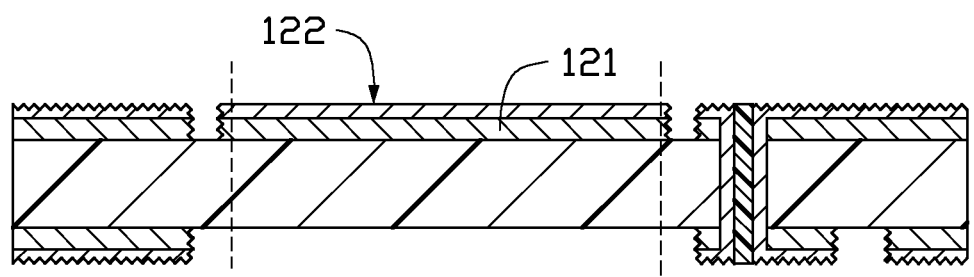
FIG. 7 shows the photoresist removed from the peelable metal layer of FIG. 6.

FIG. 7 shows step 5, in which the photoresist layer 1010 is removed from the smooth surface 122.

In the present embodiment, the photoresist layer 110 is removed from the smooth surface 122 using stripping solution. The stripping solution chemically reacts with the photoresist layer 1010, such that the photoresist layer 1010 is dissolved. Accordingly, the photoresist layer 1010 is removed from the smooth surface 122.

Figure 8:
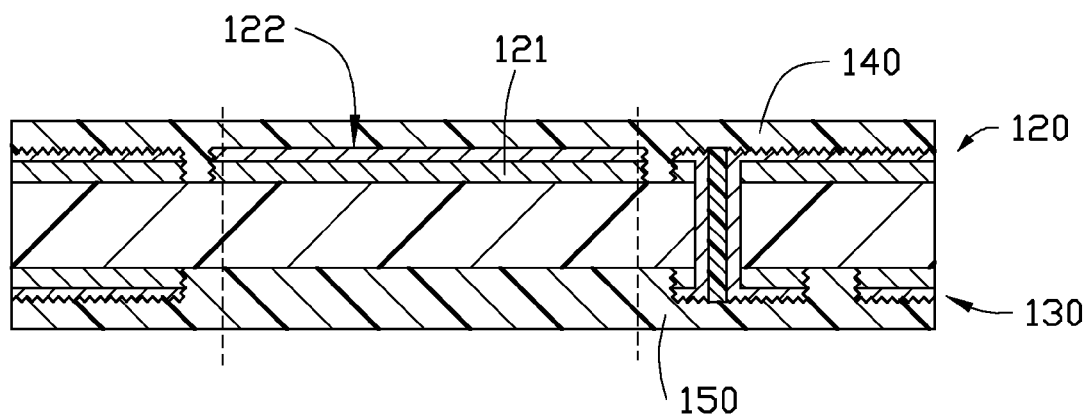
FIG. 8 shows a second dielectric layer laminated on the first trace layer and a third dielectric layer laminated on the second trace layer of FIG. 7.

FIG. 8 shows step 6, in which a second dielectric layer 140 is laminated on the surface of the first trace layer 120, the surface of the peelable metal layer 121, and the first surface exposed from the first trace layer 120. A third dielectric layer 150 is laminated on the surface of the second trace layer 130 and of the second surface 1122 exposed from the second trace layer 130.

The second dielectric layer 140 and the third dielectric layer 150 may be formed by hot laminating. Material of the second dielectric layer 140 and the third dielectric layer 150 may be polyimide, polyethylene terephthalate, polyethylene naphthalate, prepreg, and Ajinomoto build-up film.

As with the first dielectric layer 112, the second dielectric layer 140 and the third dielectric layer 150 are adhesive when heated and pressed, and the side surface 123 is roughened, thus the adhesive force between the neighboring dielectric layers, and the adhesive force between the dielectric layers and the roughened trace layers are greater than the adhesive force between the dielectric layer and smooth surface 123.

Figure 9:
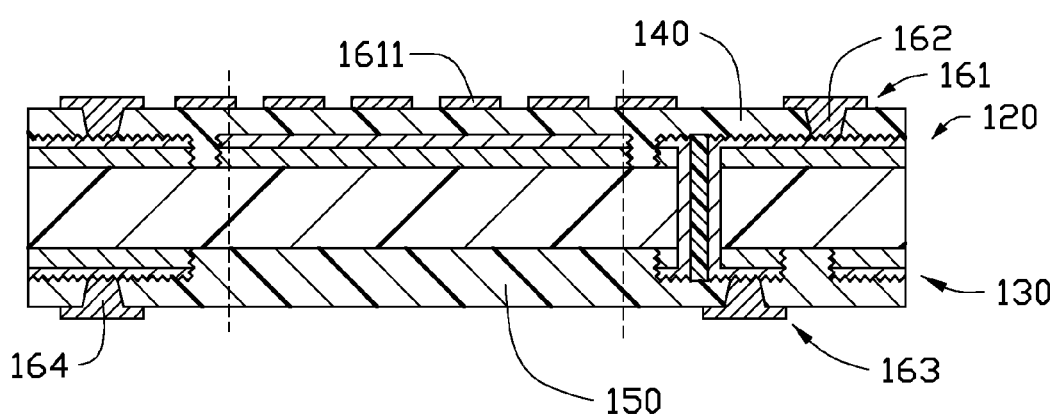
FIG. 9 shows a first blind via formed in the second dielectric layer, a second trace layer formed on the second dielectric layer, a second blind via formed in the third dielectric layer, and a fourth trace layer formed on the third dielectric layer of FIG. 8.

FIG. 9 shows step 7, in which a number of first blind vias 162 are formed in the second dielectric layer 140, a third trace layer 161 being formed on the second dielectric layer 140. The first trace layer 120 electrically connects with the third trace layer 161 through the first blind vias 162. A number of second blind vias 164 are formed in the third dielectric layer 150, and a fourth trace layer 163 is formed on the third dielectric layer 150. The second trace layer 130 electrically connects with the fourth trace layer 163 through the second blind vias 164.

The third trace layer 161, the fourth trace layer 163, the first blind vias 162 and the second blind vias 164 may be formed by semi-additive process (SAP). The third trace layer 161 includes a number of first pads 1611. The number of first pads 1611 spatially correspond to the inner region 1101. The fourth trace layer 163 spatially corresponds to trace region 1102.

Figure 10:
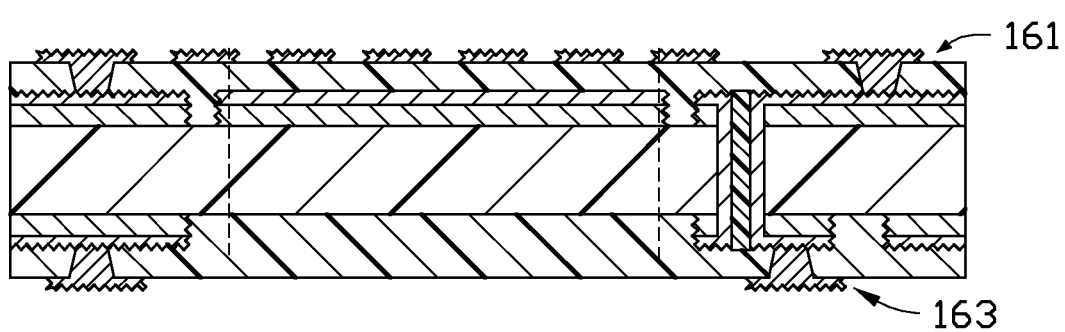
FIG. 10 shows a surface of the third trace layer and a surface of the fourth trace layer of FIG. 9 roughened.

FIG. 10 shows step 8, in which the surface of the third trace layer 161 and the surface of the fourth trace layer 163 are roughened by etching.

The surface of the third trace layer 161 and the surface of the fourth trace layer 163 are roughened using the same method as described in step 4.

Figure 11:
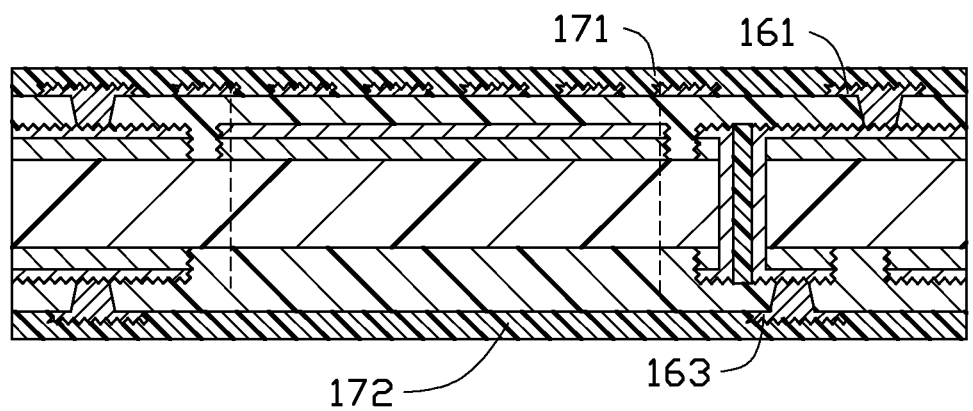
FIG. 11 shows a fourth dielectric layer laminated on the third trace layer and a fifth dielectric layer laminated on the fourth trace layer of FIG. 10.

FIG. 11 shows step 9, in which a fourth dielectric layer 171 is laminated on surface of the third trace layer 161 and on surface of the third dielectric layer 140 exposed from the third trace layer 161, and a fifth dielectric layer 172 is laminated on surface of the fourth trace layer 163 and on surface of the third dielectric layer 150 exposed from the fourth trace layer 163.

The fourth dielectric layer 171 and the fifth dielectric layer 172 may be formed by hot laminating. Material of the fourth dielectric layer 171 and the fifth dielectric layer 172 may be polyimide, polyethylene terephthalate, polyethylene naphthalate, prepreg, and Ajinomoto build-up film.

As surface of the third trace layer 161 and surface of fourth trace layer 163 are roughened, adhesive force between the third trace layer 161 and the fourth dielectric layer 171 and adhesive force between the fourth trace layer 163 and the fifth dielectric layer 172 are significantly improved.

Figure 12:
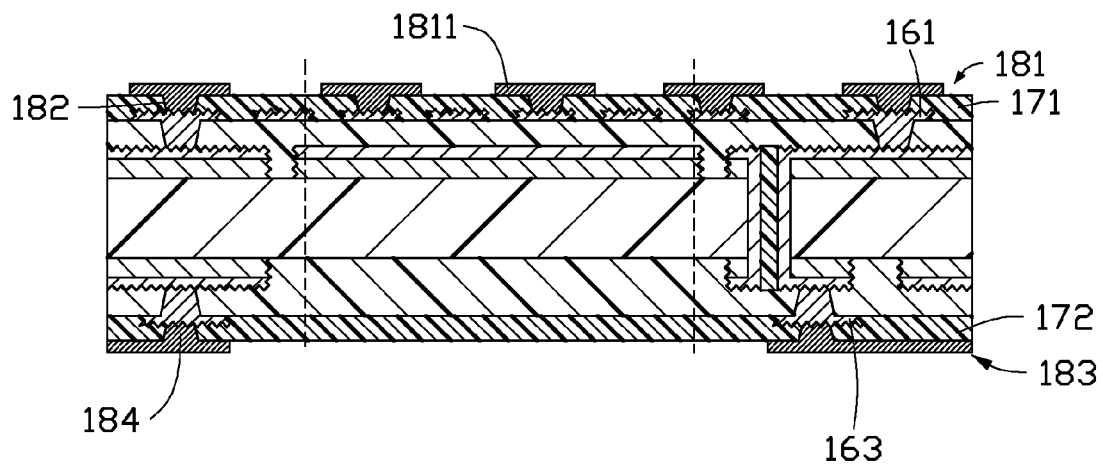
FIG. 12 shows a third blind via formed in the fourth dielectric layer, a top trace layer formed on the fourth dielectric layer, a fourth blind via formed in the fifth dielectric layer, and a bottom trace layer formed on the fifth dielectric layer of FIG. 11.

FIG. 12 shows step 10, in which a number of third blind vias 182 are formed in the fourth dielectric layer 171, a top trace layer 181 is formed on the fourth dielectric layer 171. The third trace layer 161 electrically connects with the top trace layer 181 through the third blind vias 182. A number of fourth blind vias 184 are formed in the fifth dielectric layer 172, and a bottom trace layer 183 is formed on the fifth dielectric layer 172. The fourth trace layer 163 electrically connects with the bottom trace layer 183 through the fourth blind vias 184.

The top trace layer 181, the bottom trace layer 183, the third blind vias 182 and the fourth blind vias 184 may be formed by semi-additive process . The top trace layer 181 includes a number of second pads 1811. The bottom trace layer 183 spatially corresponds to trace region 1102.

Figure 13:
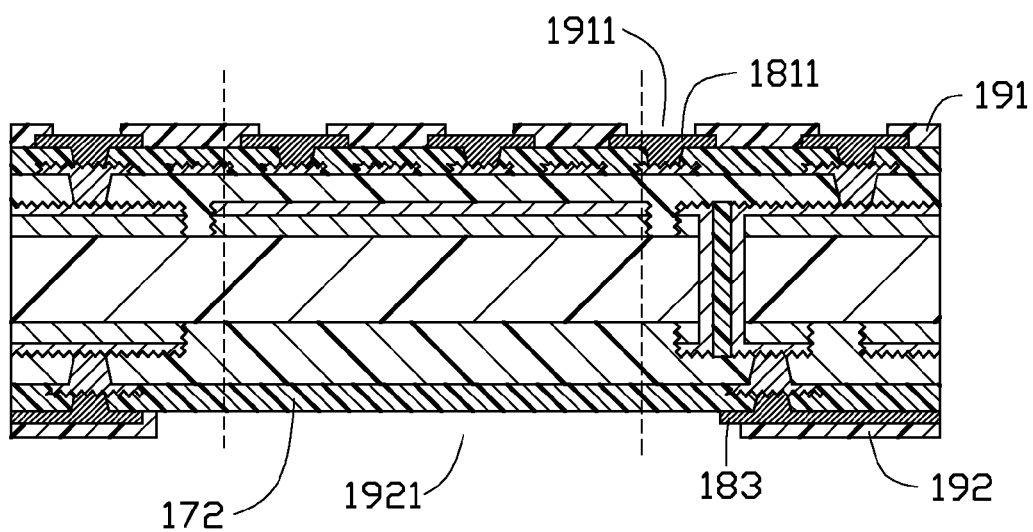
FIG. 13 shows a first solder mask formed on the top trace layer and a second solder mask formed on the bottom trace layer of FIG. 12.

FIG. 13 shows step 11, in which a first solder mask 191 is formed on the top trace layer 181 and the fifth dielectric layer 171, and a second solder mask 192 is formed on the bottom trace layer 183 and sixth dielectric layer 172.

A number of first openings 1911 are defined in the first solder mask 191. Each first opening 1911 aligns with a second pad 1811. Each second pad 1811 is exposed from one opening 1911. A second opening 1921 is defined in the second solder mask 192. Portion of the fifth dielectric layer 172 spatially corresponding to inner region 1101 and portion of the bottom trace layer 183 are exposed from the second opening 1921.

Figure 14:
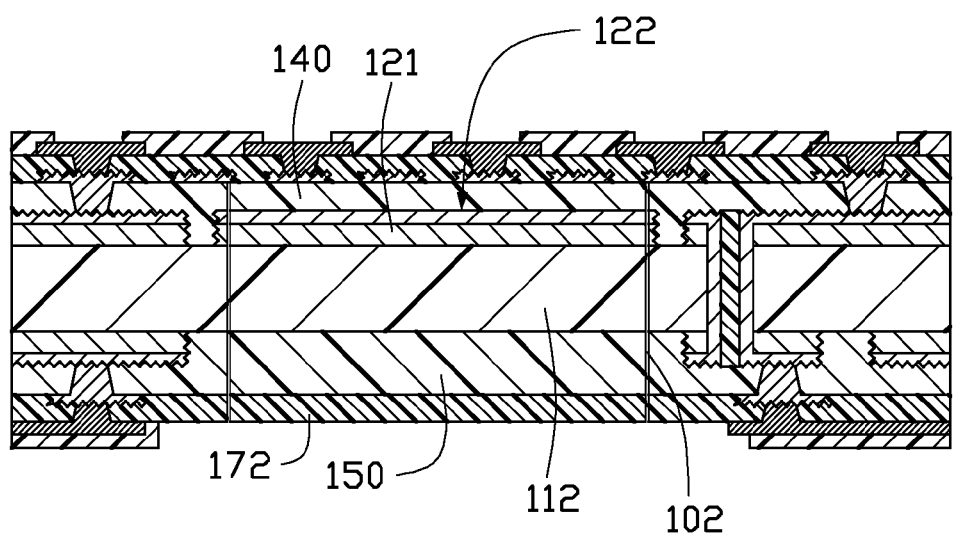
FIG. 14 shows a slit defined in the fifth dielectric layer, the third dielectric layer, the first dielectric layer, the peelable metal layer and the second dielectric layer of FIG. 13.
Figure 15:
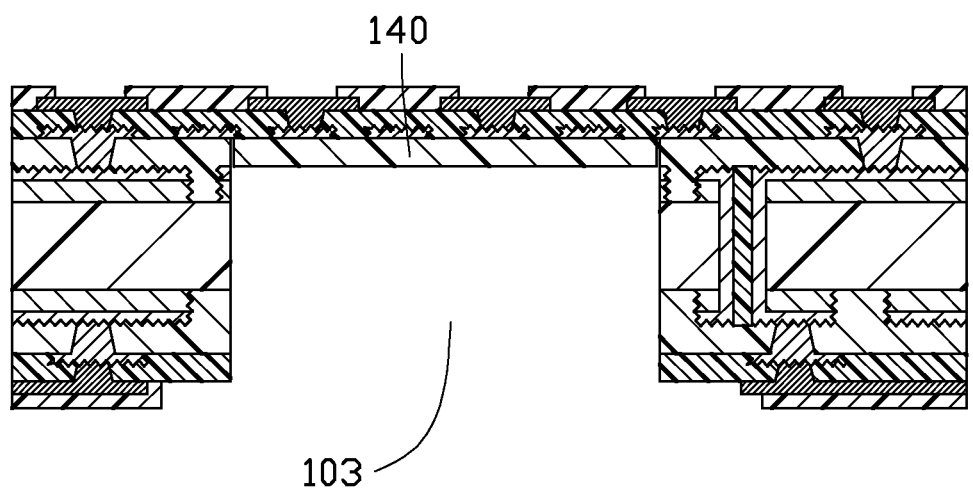
FIG. 15 shows a cavity formed in the fifth dielectric layer, the third dielectric layer, the first dielectric layer, the peelable metal layer and the second dielectric layer of FIG. 14.

FIGS. 14 and 15 show step 12, in which a slit 102 is defined along a boundary between the inner region 1101 and the trace region 1102, which is in the fifth dielectric layer 172, the third dielectric layer 150, the first dielectric layer 112, the peelable metal layer 121, and the second dielectric layer 142. Materials of the fifth dielectric layer 172, the third dielectric layer 150, the first dielectric layer 112, and the peelable metal layer 121 surrounded by the slit 102 are removed, and thereby a cavity 103 is formed.

The slit 102 can be formed by a laser. As the adhesive force between the smooth surface 122 of the peelable metal layer 121 and the second dielectric layer 140 is smaller than that between each neighboring dielectric layer (172,150, and 112), the fifth dielectric layer 172, the third dielectric layer 150, the first dielectric layer 112, and the peelable metal layer 121 surrounded by the slit 102 can be peeled or removed from the surface of second dielectric layer 140 together.

Figure 16:
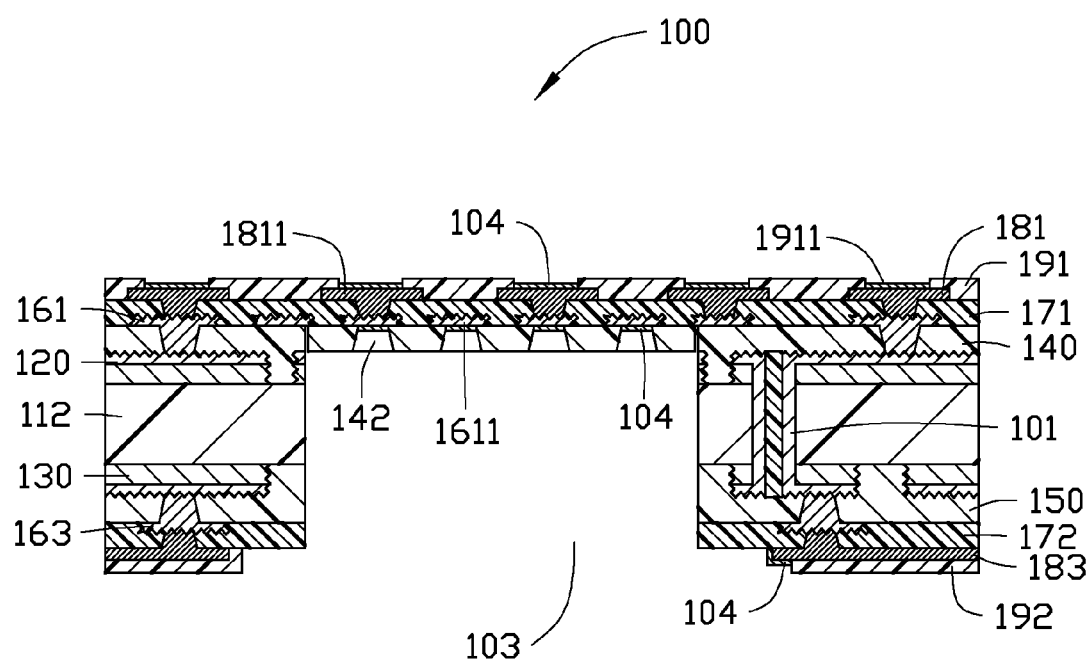
FIG. 16 shows a printed circuit board according to the exemplary embodiment.

FIG. 16 shows step 13, a number of third openings 142 are defined in the second dielectric layer 140. Each third opening 142 aligns with a first pad 1611. Each first pad 1611 is exposed from a third opening 142. The third opening 142 may be formed by laser ablation.

In present embodiment, protection layers 104 are formed on the surfaces of the first pads 1611, surfaces of the second pads 1811, and surface of bottom trace layer 183 exposed from the second solder mask 192. A material of the protection layer 104 may be tin, lead, silver, gold, nickel, palladium, and the protection layer 104 may be a single layer structure made of an alloy of one such metal, or a multilayer structure made of a combination of such metals, for example. The protection layer 104 may be made of organic solderable preservative (SOP). When the protection layer 104 is made of metal, the protection layer 104 may be formed by electroplating. When the protection layer 104 is made of organic solderable preservative, the protection layer 104 may be formed chemically.

The printed circuit board 100 obtained by the above method includes, and is arranged in this order, the top trace layer 181, the fourth dielectric layer 171, the third trace layer 161, the second dielectric layer 140, the first trace layer 120, the first dielectric layer 112, the second trace layer 130, the third dielectric layer 150, the fourth trace layer 163, the fifth dielectric layer 172, and the bottom trace layer 173. The cavity 103 is defined in the printed circuit board 110 running through from the bottom trace layer 183 to the second dielectric layer 140. The third trace layer 161 includes a number of first pads 1611. A number of third openings 142 are defined in the second dielectric layer 140 exposed in the cavity 103. Each first pad 142 aligns with and is exposed from a third opening 142. A surface of the first trace layer 120 combining with the second dielectric layer 140, a surface of the third trace layer 161 combining with the fourth dielectric layer 171, and a surface of the fourth trace layer 163 combining with the fifth dielectric layer 172 are all roughened by roughing process.

The top trace layer 181 includes a number of second pads 1811. The printed circuit board 100 also includes a first solder mask 191 and a second solder mask 192. The first solder mask 191 is formed on the top trace layer 181 and the fourth dielectric layer 171, and a second solder mask 192 is formed on the bottom trace layer 183 and fifth dielectric layer 172. A number of first openings 1911 are defined in the first solder mask 191. Each first opening 1911 aligns with a second pad 1811. Each second pad 1811 is exposed from one opening 1911.

The printed circuit board 100 also includes a number of protection layers 104. The protection layers 104 are formed on the surfaces of the first pads 1611, surfaces of the second pads 1811, and surface of bottom trace layer 183 exposed from the second solder mask 192.

The printed circuit 100 may not include the third dielectric layer 150, the fourth trace layer 163, the fifth dielectric layer 172 and the bottom trace layer 183. Accordingly, the cavity 103 would only run through from the second trace layer 172 to the second dielectric layer 140. The printed circuit 100 also may not include the fifth dielectric layer 172 and the bottom trace layer 183. Accordingly, the cavity 103 would only run through from the fourth trace layer 163 to the second dielectric layer 140.

In the method for manufacturing the printed circuit board 100, the peelable metal layer 121 includes a smooth surface 122, and the surface of the first trace layer 120 combining with the second dielectric layer 140, the surface of the third trace layer 161 combining with the fourth trace layer 171, and the surface of the fourth trace layer 163 combining with the top trace layer 172 are all roughened. Accordingly, the adhesive force between the trace layers and dielectric layers is greater than that between the peelable metal layer and dielectric layers, thus, when forming the cavity 103, the peelable metal layer 121 can be easily peeled from the second dielectric layer 140. In addition, in the method for manufacturing the printed circuit board 100, the peelable metal layer 121 and the first trace layer 120 are formed simultaneously, thus another peelable film is omitted. Thereby the cost of manufacturing the printed circuit board 100 is reduced.

It can be understood, the peelable metal layer also can be formed in other trace layer according to the cavity to be defined. Thus, the present method can manufacture printed circuit boards with different depth cavity.

While certain embodiments have been described and exemplified above, various other embodiments will be apparent from the foregoing disclosure to those skilled in the art. The disclosure is not to be limited to the particular embodiments described and exemplified but is capable of considerable variation and modification without departure from the scope and spirit of the appended claims.

What is claimed is:

1. A method for manufacturing a printed circuit board, comprising:
   providing a core substrate comprising a first dielectric layer, the core substrate having an inner region and a trace region surrounding and connected with the inner region, the first dielectric layer having a first surface and a second surface opposite to the first surface;
   forming a first trace layer and a peelable metal layer on the first surface and forming a second trace layer on the second surface in the trace region, the peelable metal layer being formed in the inner region, the peelable metal layer having a smooth surface furthest away from the first surface;
   forming a photoresist layer on the smooth surface;

roughening surfaces of the first trace layer and surfaces of the peelable metal layer uncovered by the photoresist layer;

removing the photoresist layer from the smooth surface;

laminating a second dielectric layer on the first trace layer and the peelable metal layer;

forming a third trace layer on a surface of the second dielectric layer furthest away from the first dielectric layer;

roughening surfaces of the third trace layer;

laminating a fourth dielectric layer on the third trace layer and the second dielectric layer;

forming a top trace layer on a surface of the fourth dielectric layer furthest away from the second dielectric layer; and along a boundary between the inner region and the trace region, defining a slit running through from the first dielectric layer to the second dielectric layer;

separating the peelable metal layer from the second dielectric layer and removing the peelable metal layer and the first dielectric layer surrounded by the slit to form a cavity, the second dielectric layer exposed in the cavity.

2. The method of claim 1, further comprising defining a plurality of first openings in the second dielectric layer in the cavity, the third trace layer comprises a plurality of first pads, each first pad aligned with and exposed from a corresponding first opening.

3. The method of claim 2, further comprising forming protection layers on surfaces of the first pads exposed from the first openings.

4. The method of claim 1, wherein a plated through hole is formed in the first dielectric layer.

5. The method of claim 4, wherein the core substrate further comprises a first copper layer arranged on the first surface and a second copper layer arranged on the second surface, a method for forming the first trace layer, the second trace layer and the plated through hole comprising:

defining a through hole in the core substrate;

forming a plated metal layer over an inner wall of the through hole, a surface of the first copper layer, and a surface of the second copper layer; and forming the first trace layer by selectively removing portions of the first copper layer and the plated metal layer in the trace region, and forming the second trace layer by selectively removing portions of the second copper layer and the plated metal layer in the trace region, thereby the first copper layer and the plated metal layer remaining on the first surface in the inner region cooperatively constituting the peelable metal layer.

6. The method of claim 1, wherein surfaces of the second trace layer are roughened.

7. The method of claim 1, wherein the top trace layer comprises a plurality of second pads, the method further comprising:

forming a first solder mask on a surface of the top trace layer and exposed surfaces of the fourth dielectric layer, a plurality of second openings defined in the first solder mask, each second pad aligned with and exposed from a corresponding second opening.

8. The method of claim 7, further comprising forming protection layers on surfaces of the second pads exposed from the second openings.

9. The method of claim 1, wherein the roughening surfaces of the first trace layer and surfaces of the second trace layer comprises using an etching process.

10. The method of claim 1, wherein a plurality of blind vias is formed in the fourth dielectric layer, the top trace layer is electrically connected with the third trace layer through the blind vias.

11. A method for manufacturing a printed circuit board, comprising:

providing a core substrate comprising a first dielectric layer, the core substrate having an inner region and a trace region surrounding and connected with the inner region, the first dielectric layer having a first surface and a second surface opposite to the first surface;

forming a first trace layer and a peelable metal layer on the first surface and forming a second trace layer on the second surface in the trace region, the peelable metal layer being in the inner region, the peelable metal layer having a smooth surface furthest away from the first surface;

forming a photoresist layer on the smooth surface;

roughening surfaces of the first trace layer, surfaces of the second trace layer, and surfaces of the peelable metal layer uncovered by the photoresist layer;

removing the photoresist layer from the smooth surface;

laminating a second dielectric layer on the first trace layer and the peelable metal layer and laminating a third dielectric layer on the second trace layer;

forming a third trace layer on a surface of the second dielectric layer furthest away from the first dielectric layer and forming a fourth trace layer on a surface of the third dielectric layer furthest away from the first dielectric layer;

roughening surfaces of the third trace layer and surfaces of the fourth trace layer;

laminating a fourth dielectric layer on the third trace layer and the second dielectric layer, and laminating a fifth dielectric layer on the fourth trace layer and the third dielectric layer;

forming a top trace layer on a surface of the fourth dielectric layer furthest away from the second dielectric layer, and forming a bottom trace layer on a surface of the fifth dielectric layer furthest away from the third dielectric layer corresponding to the trace region; and along a boundary between the inner region and the trace region, defining a slit running through from the fifth dielectric layer to the second dielectric layer;

separating the peelable metal layer from the second dielectric layer and removing the peelable metal layer, the first dielectric layer, the third dielectric layer and the fifth dielectric layer surrounded by the slit to form a cavity, the second dielectric layer exposed in the cavity.

12. The method of claim 11, further comprising defining a plurality of first openings in the second dielectric layer in the cavity, the third trace layer comprises a plurality of first pads, each first pad aligned with and exposed from a corresponding first opening.

13. The method of claim 11, wherein the surfaces of the first, second, third, and fourth trace layers are roughened using an etching process.

* * * * *